United States Patent
Soichi et al.

[11] Patent Number: 6,134,279
[45] Date of Patent: Oct. 17, 2000

[54] PEAK DETECTOR USING AUTOMATIC THRESHOLD CONTROL AND METHOD THEREFOR

[75] Inventors: Iwamura Soichi; Jin-kyu Jeon, both of Suwon, Rep. of Korea

[73] Assignee: Samsung Electronics Co., Ltd., Kyungki-do, Rep. of Korea

[21] Appl. No.: 09/020,340

[22] Filed: Feb. 9, 1998

[30] Foreign Application Priority Data

Jul. 1, 1997 [KR]  Rep. of Korea ................ 97-30468

[51] Int. Cl.[7] .............. H03D 1/00; H03K 5/153; H04L 25/06; H04L 23/00
[52] U.S. Cl. .............. 375/341; 375/317; 375/377; 327/58
[58] Field of Search .................. 375/341, 262, 375/317, 377, 318, 319; 327/58, 60, 62; 360/39, 46, 55

[56] References Cited

U.S. PATENT DOCUMENTS 5,373,400   12/1994   Kovacs ........................ 375/341

FOREIGN PATENT DOCUMENTS 0 371 400   6/1990   European Pat. Off. ......... H03K 5/08
0 551 858   7/1993   European Pat. Off. ......... H04N 7/00

OTHER PUBLICATIONS

"Analog Switch Cuts Peak–Detector Reset Time" Bolognesi et al., EDN Electrical Design News, vol. 40, No. 11, May 25, 1995, p. 88, XP000520332.

"Der Goldene Mittelweg" Marguerre, Elektronik, vol. 33, No. 9, May 1989, pp. 65–68, XP002082042 Munchen, DE.

Primary Examiner—Stephen Chin
Assistant Examiner—Betsy L. Deppe
Attorney, Agent, or Firm—Sughrue, Mion, Zinn, Macpeak & Seas, PLLC

[57] ABSTRACT

A peak detector for a maximum likelihood decoding system, using an automatic threshold control (ACT), and a method therefor are provided. In the peak detector, positive and negative peak values are detected from an input signal having digital information, based on positive and negative threshold values, and then each threshold value is evaluated according to positive and negative values of the input signal, to reset each threshold value to a predetermined value based on the detected peak value having the opposite polarity thereto. Accordingly, data can be detected exactly, improving performance of Viterbi decoding.

18 Claims, 6 Drawing Sheets

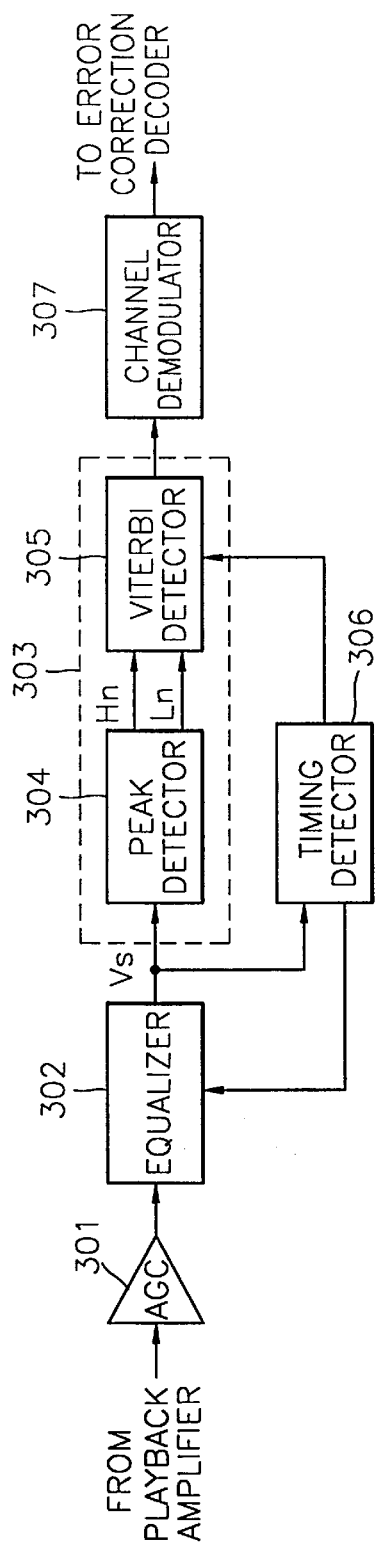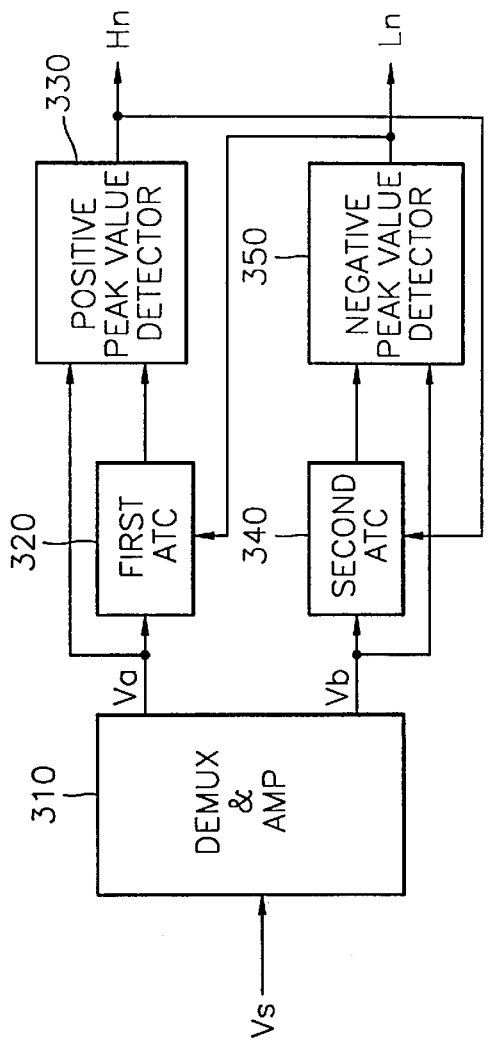

PEAK DETECTOR USING AUTOMATIC THRESHOLD CONTROL AND METHOD THEREFOR

BACKGROUND OF THE INVENTION

1. Field of the Invention

The present invention relates to a maximum likelihood decoding, and more particularly, to an apparatus for improving performance of Viterbi decoding by effectively detecting the peak value of an input signal using automatic threshold control (ACT) for detecting digital information of an input signal, and a method therefore.

2. Description of the Related Art

For increasing the recording density of a signal without a significant change in the characteristics of the conventional recording/reproducing system, technology relating to partial response maximum likelihood (PRML), including a Viterbi decoding process, has been advanced, and a lot of specific circuits have been suggested.

FIG. 1 is a block diagram of a digital recording/reproducing apparatus as an example of the PRML-4 system. In FIG. 1, analog video and audio signals are converted into digital data by first and second analog-to-digital (A/D) converters 110 and 120. The video data output from the first A/D converter 110 is compressed through a high-efficiency coding process by a video data encoder 130, and then output to an error correction encoder 150. The audio data output from the second A/D converter 120 is coded by an audio data encoder 140 to be suitable for recording, and then also output to the error correction encoder 150. The error correction encoder 150 mixes the video data output from the video data encoder 130 and the audio data output from the audio data encoder 140, and adds a parity to the data using an error correction code, e.g., Reed Solomon code, to output the error-correction-coded data to a recording encoder 160. The recording encoder 160 modulates the error-correction-coded data according to a predetermined modulation scheme to be suitable for the characteristics of a recording channel, equalizes the modulated data to compensate for nonlinearities in the recording process, and outputs the equalized result to a recording amplifier 170. The signal amplified by the recording amplifier 170 is recorded on a recording medium T by a recording head HD1.

The signal recorded on the recording medium T is reproduced by a playback head HD2, and then amplified by a playback amplifier 210. A data detector 220 detects video and audio data from the amplified signal. An error correction decoder 230 corrects errors in the video and audio data detected by the data detector 220, and outputs the error-correction-decoded video and audio data to a video data decoder 240 and an audio data decoder 250, respectively. The video data decoder 240 decodes the error-correction-decoded video data to output video data to be finally restored by a first digital-to-analog (D/A) converter 260. The audio data decoder 250 decodes the error-correction-decoded audio data to output audio data to be finally restored by the second D/A converter 270.

FIG. 2 is a detailed block diagram of the data detector shown in FIG. 1, for detecting the data by a digital method. In FIG. 2, an automatic gain control (AGC) amplifier 221 automatically controls the amplitude of a reproduced signal amplified by the playback amplifier 210 of FIG. 1 to have a constant level. A low-pass filter (LPF) 222 low-pass-filters the signal output from the AGC amplifier 221 to remove a high frequency component of noise overlapping with the signal in the output of the AGC amplifier 221. An A/D converter 223 converts the low-pass filtered signal into digital data, and an equalizer 224 compensates distortion in the waveform and amplitude of the digital data to output the result to a maximum likelihood decoder 225. A timing detector 226 detects the timing of the reproduced signal equalized by the equalizer 224 using a phase-locked loop (PLL) included therein, and outputs a driving clock which is required for the A/D converter 223, the equalizer 224 and the maximum likelihood decoder 225. A channel demodulator 227 demodulates the maximum-likelihood-decoded data output from the maximum likelihood decoder 225 based on a modulation scheme used for the modulation, and outputs the result to the error correction decoder 230 of FIG. 1.

Here, the maximum likelihood decoder 225 includes a Viterbi decoder for determining whether data detected at a given time is precise, or data which passed through a trellis diagram is correct. That is, the Viterbi decoder calculates metrics for each pass to select a surviving path, and stores information of the surviving path in a memory according to each state, thereby decoding the input data by the final surviving path data read out from the memory, having the same shape as the trellis diagram.

Also, a peak detector using a conventional automatic threshold control (ATC) is installed before the Viterbi decoder of the maximum likelihood decoder 225. When the states are binary, a peak value of the signal in the positive direction (hereinafter, "positive peak") and a peak value of the signal in the negative direction (hereinafter, "negative peak") basically correspond to the metrics. Thus, the peak detector enables the detection of the positive peak of the input signal for maintaining the level of that value as a new threshold to detect consecutive positive peaks, and for updating a threshold for detecting the negative peak. Here, in the same manner, the peak detector enables the detection of the negative peak of the input signal for maintaining the level of that value as a new threshold to detect consecutive negative peaks and for updating a threshold for detecting the positive peak.

An example of the above-mentioned peak detector is shown in FIG. 3. In FIG. 3, a positive peak value detector 225.2 with a comparator COMP1, and a negative peak value detector 225.3 with a comparator COMP2, simultaneously detect positive and negative peak values of the equalized signal output via an amplifier 225.1. That is, the positive and negative peak values of the output signal from the equalizer 224 of FIG. 2 are detected while maintaining an offset A which is a predetermined difference between threshold values $T_H$ and $T_L$ of the positive peak value detector 225.2 and the negative peak detector 225.3. Here, the offset A is equal to Vr+Vd, and updating the threshold values according to the input signal and maintaining the difference between the threshold values of the positive peak value detector 225.2 and the negative peak detector 225.3 with a constant offset is called "ATC".

The operation principle of the peak detector of FIG. 3 is shown in FIG. 4. That is, the positive peak value detector 225.2 has an output Hn of logic "1" when an input signal Vi output from the amplifier 225.1 is greater than the threshold value $T_H$ for the positive peak value detection (hereinafter simply referred to as "positive threshold value"), and of logic "0" otherwise. The negative peak value detector 225.3 has an output Ln of logic "1" when the input signal Vi is less than the threshold value $T_L$ for the negative peak value detection (hereinafter simply referred to as "negative threshold value"), and of logic "0" if otherwise.

As described above, if the positive peak value is detected, the detected value is maintained to be set as a new positive threshold value, and simultaneously the negative threshold value is updated to a value which is less than the positive threshold value by the offset A. The negative threshold value is updated to be less than the positive threshold by the offset A because the minimum distance of the metrics is determined when the negative peak value is detected following the positive peak value. In addition, a path of the trellis diagram is decided until a time point at which the previous positive peak value which is the nearest from the detected negative peak value was generated. That is, the path having the minimum metric is selected.

In the same manner, if the negative peak value is detected, the detected value is maintained to be set as a new negative threshold value, and simultaneously the positive threshold value is updated to a value which is greater than the threshold value by the offset A. The predetermined offset A between the negative and positive threshold values changes according to a peak-to-peak value of the input signal.

However, the peak detector of FIG. 3 detects the peak value of the input signal having digital information "+1", as an example, when digital information "+1" and "−1" of the input signal are alternately input, to set a new positive threshold value according to the detected peak value, and simultaneously updates a negative threshold value having an opposite polarity of the detected peak value. At this time, if the next input signal having signal information "−1" is input before the negative threshold value is completely updated, a data is detected by a threshold value which does not have a constant offset A. Thus, if the threshold value of the opposite polarity of the detected peak value is not updated completely at an intended time, a data detection error occurs, lowering performance of the Viterbi decoding. In addition, when the peak detector detects the input signal "0" as "1", the detection error can be corrected by a Viterbi decoder. However, if the input signal "1" is detected as "0", this detection error cannot be corrected by the Viterbi decoder. Thus, the data detection error influences the performance of the Viterbi decoding.

SUMMARY OF THE INVENTION

To solve the above problems, it is an object of the present invention to provide a peak detector in which thresholds for detecting positive and negative peak values are individually set according to an input signal, and each threshold is controlled by the peak value having the opposite polarity thereto.

It is another object of the present invention to provide a peak detection method in which thresholds for detecting positive and negative peak values are separately set according to an input signal, and each threshold is controlled by the peak value having the opposite polarity thereto.

To achieve the first object, there is provided a peak detector comprising: a detector which detects positive and negative peak values from an input signal having digital information, based on positive and negative threshold values; and a threshold controller which evaluates each threshold value according to positive and negative values of the input signal, to reset each threshold value to a predetermined value based on the detected peak value having the opposite polarity thereto.

To achieve the second object, there is provided a peak detection method comprising the steps of: (a) detecting positive and negative peak values from an input signal having digital information, based on positive and negative threshold values; and (b) evaluating each threshold value according to positive and negative values of the input signal, to reset each threshold value to a predetermined value based on the detected peak value having the opposite polarity thereto.

BRIEF DESCRIPTION OF THE DRAWINGS

The above objects and advantages of the present invention will become more apparent by describing in detail a preferred embodiment thereof with reference to the attached drawings in which:

FIG. 5 is a block diagram of a data detector applied to the present invention;

FIG. 6 is a block diagram of a peak detector of FIG. 5 according to a preferred embodiment of the present invention;

DESCRIPTION OF THE PREFERRED EMBODIMENT

A peak detector using automatic threshold control (ATC) and a peak detection method according to a preferred embodiment of the present invention will be described.

Figure 1:
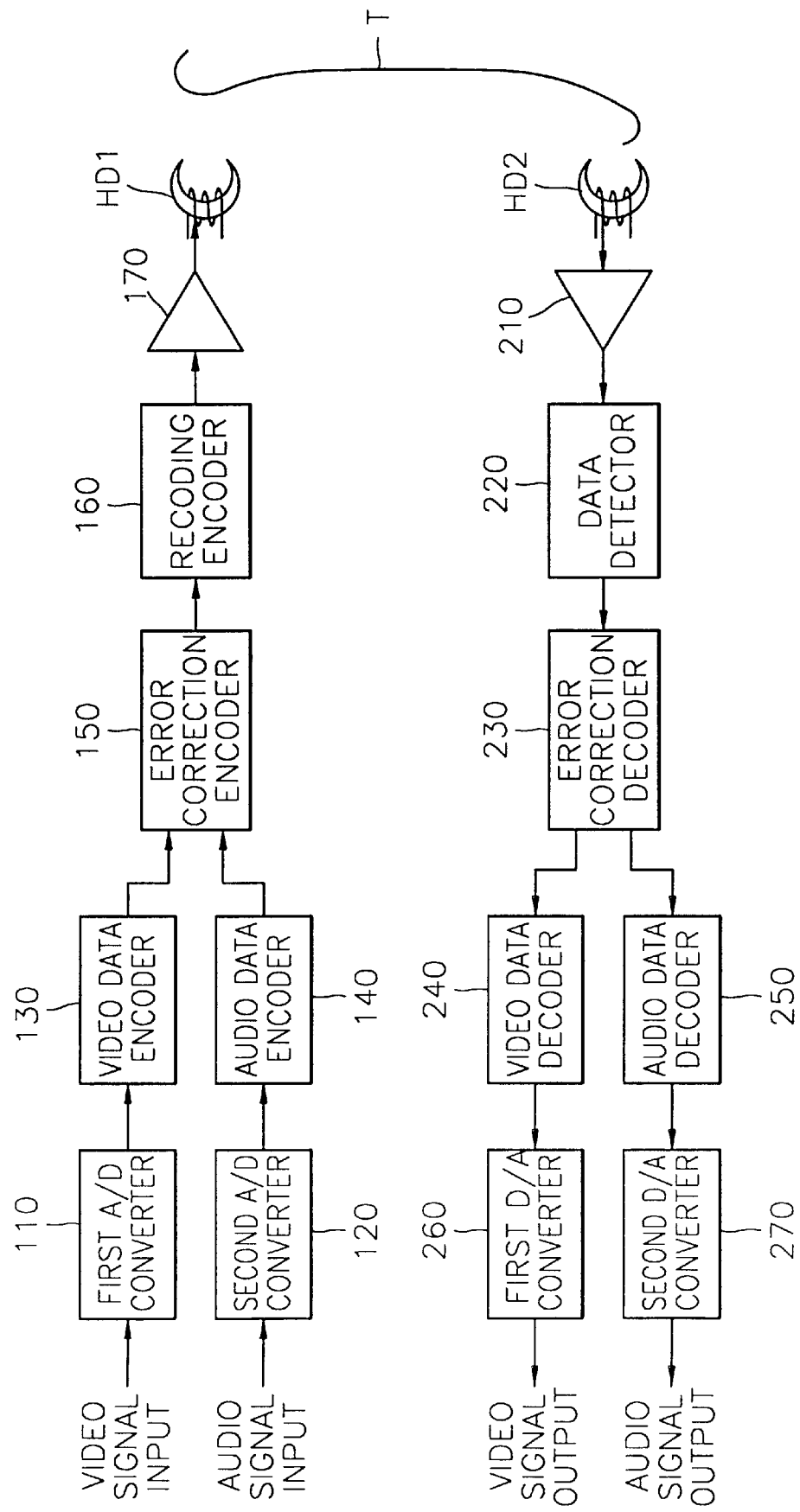
FIG. 1 is a block diagram of a general digital recording/reproducing apparatus.
Figure 2:
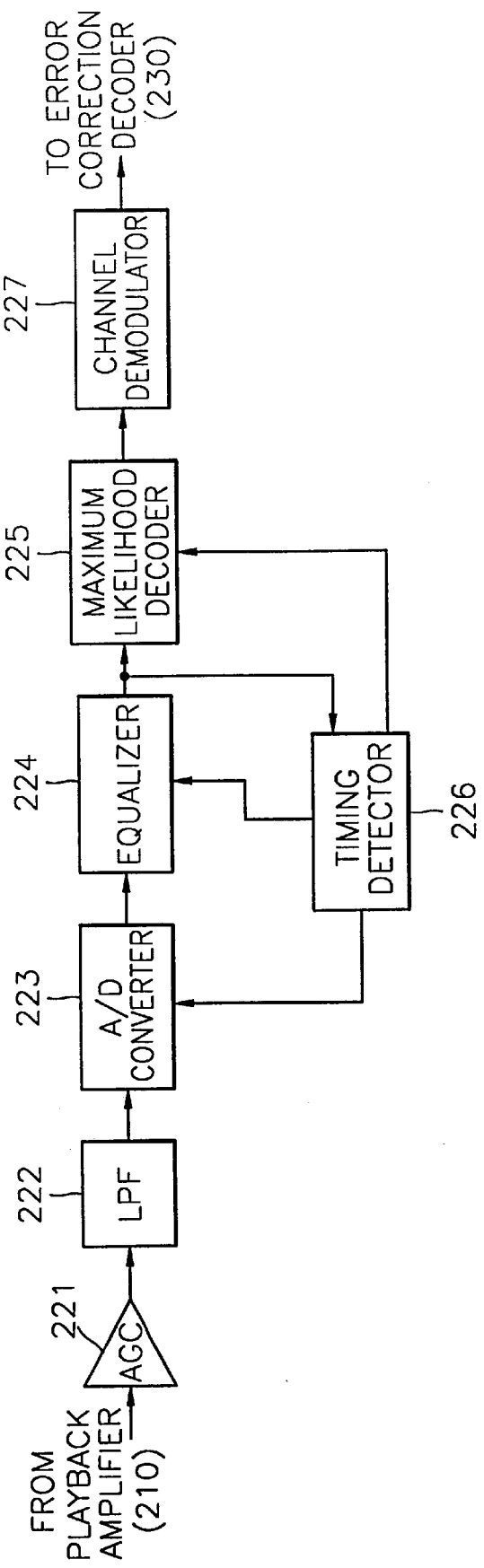
FIG. 2 is a detailed block diagram of the data detector of FIG. 1.
Figure 3:
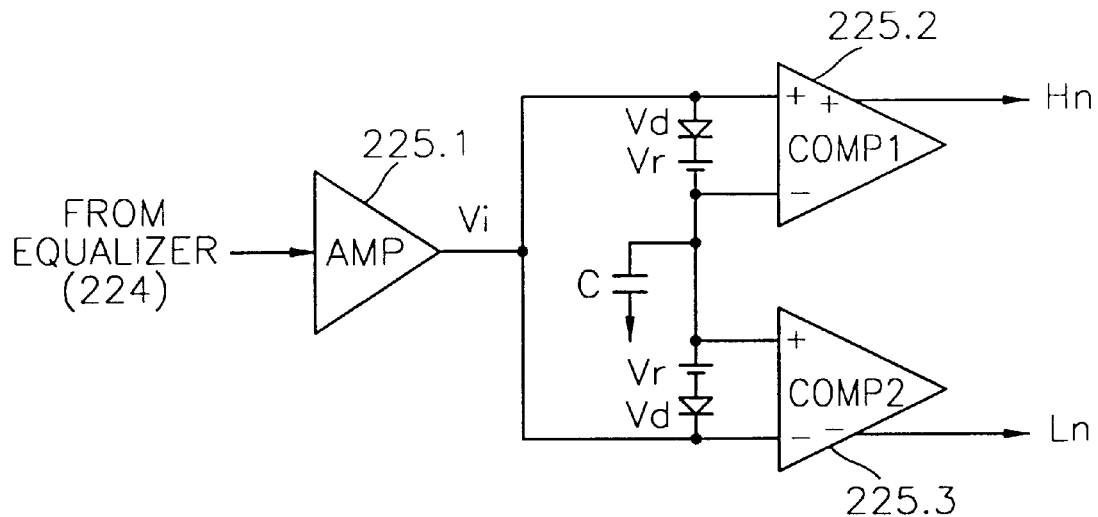
FIG. 3 is a detailed circuit diagram of the peak detector included in the maximum likelihood decoder of FIG. 2.
Figure 4:
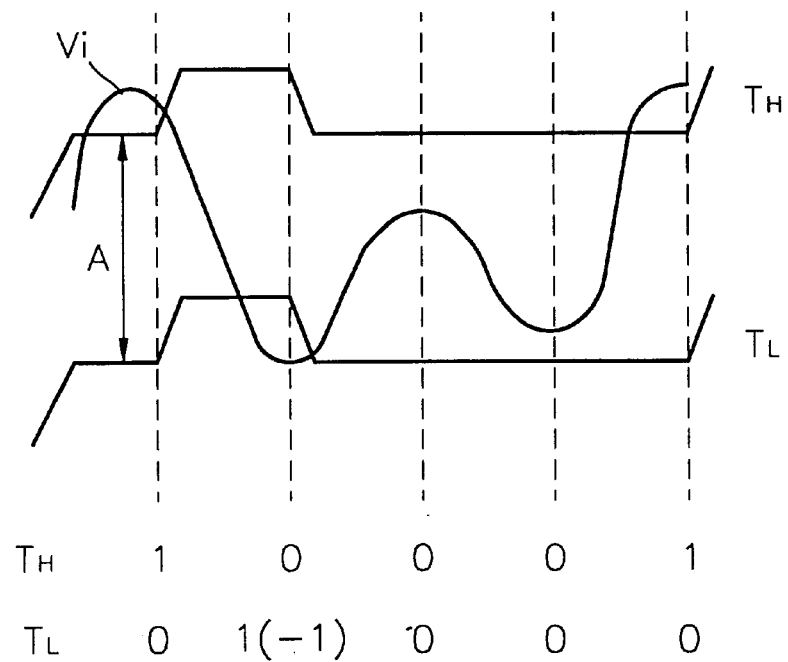
FIG. 4 is a diagram illustrating the operating principle of the peak detector of FIG. 3.

FIG. 5 shows a data detector which is applied to the present invention; however, the data detector of FIG. 2 may be alternatively applied to the present invention. In FIG. 5, an automatic gain control (AGC) amplifier 301 automatically controls a reproduced signal output from a playback amplifier to have a constant amplitude, and outputs the constant amplitude to an equalizer 302. A peak detector 304 of a maximum likelihood decoder 303 detects a positive peak value Hn and a negative peak value Ln according to positive and negative threshold values which are set by the equalized signal provided by the equalizer 302 and controlled by the peak value having the opposite polarity. A Viterbi decoder 305 receives the positive peak value Hn and the negative peak value Ln detected by the peak detector 304 to perform a Viterbi decoding. A timing detector 306 detects the timing of the reproduced signal equalized by the equalizer 302 to output driving clock signals required for the equalizer 302 and the Viterbi decoder 305. A channel demodulator 307 demodulates the Viterbi-decoded data based on the modulation scheme used for modulation to output it to an error correction decoder.

The data detector of FIG. 5 adopts an analog mode without using an analog-to-digital (A/D) converter, in contrast to the data detector adopting a digital mode of FIG. 2. The Viterbi decoder 305 of FIG. 5 which functions without using an A/D converter (hereinafter simply referred to as "analog Viterbi decoder") is constituted of a shift register. The analog Viterbi decoder has a simpler circuit structure than a conventional Viterbi decoder, thereby minimizing area of an integrated circuit (IC). Accordingly, manufacturing costs and power consumption can be reduced.

According to the peak detector and peak detection method of the present invention, the data detection error caused in the conventional peak detector, when a threshold value is not updated in time, does not occur. Also, even though the peak detector of the present invention is applied to the data detector adopting an analog mode of FIG. 5, performance similar to that of the data detector adopting a digital mode of FIG. 2 can be secured.

FIG. 6 is a block diagram of the peak detector according to a preferred embodiment of the present invention. In FIG. 6, a demultiplexer and amplifier (DEMUX & AMP) 310 detects positive (+) values from the equalized signal Vs output from the equalizer 302 of FIG. 5, to output a positive signal Va amplified to a predetermined level to a first automatic threshold controller (ATC) 320 and a positive peak value detector 330, and negative (−) values from the equalized signal Vs to output a negative signal Vb amplified to a predetermined level to a second ATC 340 and a negative peak value detector 350.

The first ATC 320 automatically sets a positive threshold value, according to the amplified positive signal Va output from the DEMUX & AMP 310, and resets the positive threshold value to a predetermined value at a point in time when a negative peak value is detected by the negative peak value detector 350. The positive peak value detector 330 compares the positive threshold value set by the first ATC 320 with the amplified positive signal Va, to output a positive peak value Hn corresponding to the amplified positive signal Va, and to simultaneously feed back the positive peak value Hn to the second ATC 340.

The second ATC 340 automatically sets a negative threshold value, according to the amplified negative signal Vb output from the DEMUX & AMP 310, and resets the negative threshold value to a predetermined value at a point in time when a positive peak value is detected by the positive peak value detector 330. The negative peak value detector 350 compares the negative threshold value set by the second ATC 340 with the amplified negative signal Vb, to output a negative peak value Ln corresponding to the amplified negative signal Vb, and to simultaneously feed back the negative peak value Ln to the first ATC 320.

Figure 7:
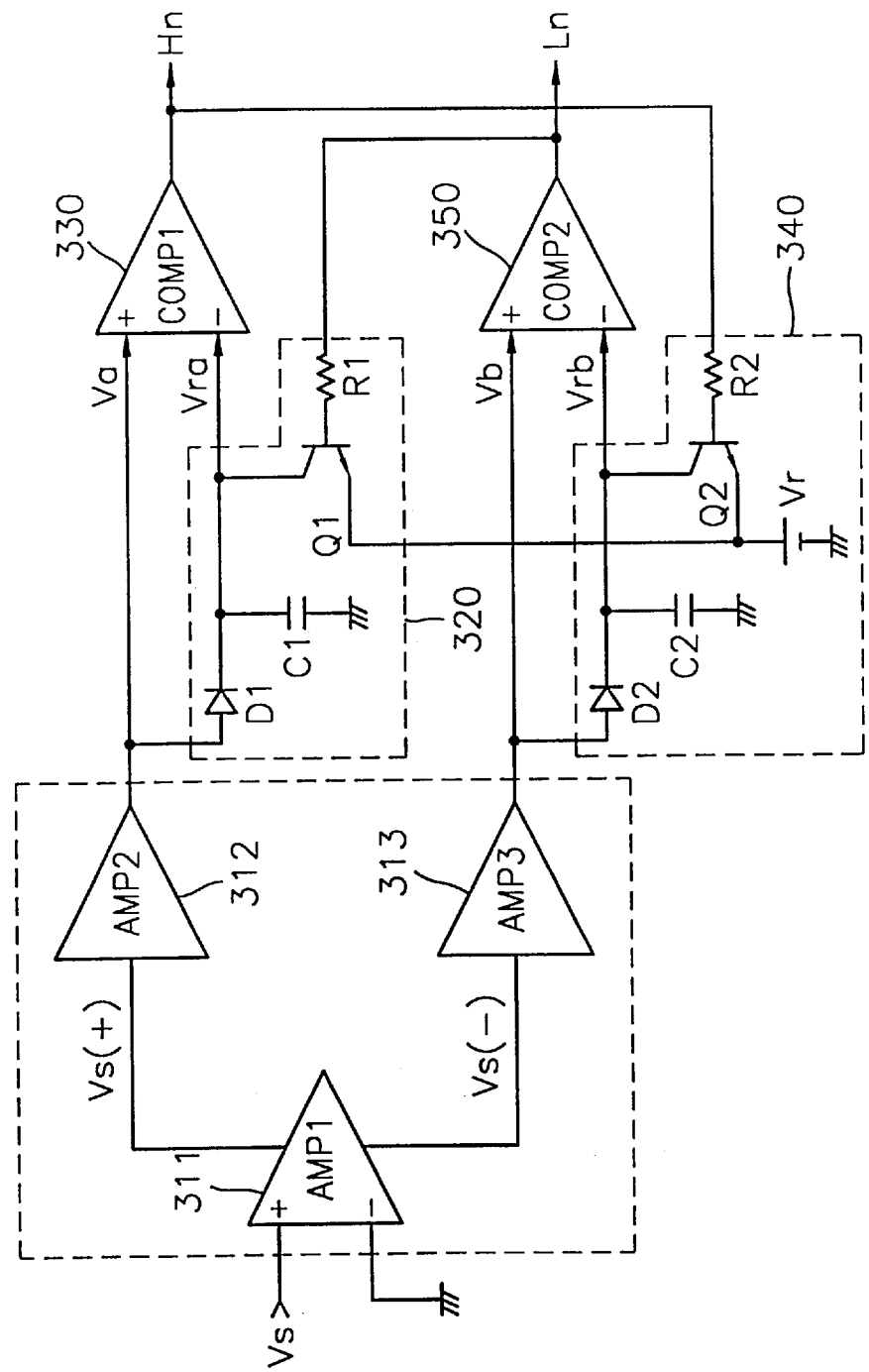
FIG. 7 is a detailed circuit diagram of the peak detector of FIG. 6.

FIG. 7 is a detailed circuit diagram of the peak detector of FIG. 6. In FIG. 7, the first amplifier (AMP1) 311 outputs a signal Vs(+) having the positive phase from the input signal, i.e., the equalized signal Vs output from the equalizer, and a signal Vs(−) having the negative phase from the input signal, to a second amplifier (AMP2) 312 and a third amplifier (AMP3) 313, respectively. The AMP2 312 selects only positive values, i.e., values corresponding to the detection point of "+1", from the signal Vs(+) output from the AMP1 311, to amplify the positive values to a predetermined level, and then outputs the amplified positive signal Va to the positive peak value detector 330 constituted of a comparator COMP1. The AMP3 313 selects only negative values, i.e., values corresponding to the detection point of "−1", from the negative signal Vs(−) output from the AMP1 311, to amplify the negative values to a predetermined level, and then outputs the amplified negative signal Vb to the negative peak value detector 350 constituted by a comparator COMP2.

The first ATC 320 includes a first half-wave rectifier having a first diode D1 and a first capacitor C1 which are serially connected, and a first transistor Q1 having a base connected to the output of the negative peak value detector 350 via a first base resistor R1, a collector connected to the output of the first half-wave rectifier and an emitter connected to a reference voltage source Vr. The second ATC 340 includes a second half-wave rectifier having a second diode D2 and a second capacitor C2 which are serially connected, and a second transistor Q2 having a base connected to the output of the positive peak value detector 330 via a second base resistor R2, a collector connected to the output of the second half-wave rectifier and an emitter connected to the reference voltage source Vr.

The positive peak value detector 330 compares the amplified positive signal Va from the AMP2 312, input to a non-inverting port (+), with a positive threshold value Vra from the first half-wave rectifier of the first ATC 320, input to an inverting port (−) and changed according to the amplified positive signal Va, to output a signal Hn which is logic "high" only when the amplified positive signal Va is greater than the positive threshold value Vra, thereby detecting only a positive peak value.

Meanwhile, the output signal Hn of the positive peak value detector 330 is fed back to the base of the second transistor Q2 of the second ATC 340 to control the negative threshold value Vrb input to the inverting port (−) of the negative peak value detector 350. Here, the second transistor Q2 is turned on at only a point in time when the output signal Hn of the positive peak value detector 330 becomes logic "high", such that the negative threshold value Vrb becomes equal to the reference voltage Vr, and then prepares to detect a negative peak value.

In the same manner, the negative peak value detector 350 compares the negative signal Vb which is amplified by the AMP3 313, input to a non-inverting port (+), with a negative threshold value Vrb from the second half-wave rectifier of the second ATC 340, input to an inverting port(−), and changed according to the amplified negative signal Vb, to output a signal Ln which is logic "high" only when the amplified negative signal Vb is less than the negative threshold value Vrb, thereby detecting only a negative peak value. Meanwhile, the output signal Ln of the negative peak value detector 350 is fed back to the base of the first transistor Q1 of the first ATC 330 to control the positive threshold value Vra input to the inverting port(−) of the positive peak value detector 330. Here, the first transistor Q1 is turned on at only a point in time when the output signal Ln of the negative peak value detector 350 becomes logic "high", such that the positive threshold value Vra becomes equal to the reference voltage Vr, and then prepares to detect a positive peak value.

Here, the data detection performance can be further increased by appropriately setting the positive threshold value Vra determined by the turn-on voltage of the first diode D1 and capacitance of the first capacitor C1, and the negative threshold value Vrb determined by the turn-on voltage of the second diode D2 and capacitance of the second capacitor C2. Also, the reference voltage Vr is shared by the first ATC 320 and the second ATC 340 to simplify the circuit; however, the reference voltage Vr may be separated.

Figure 8A:
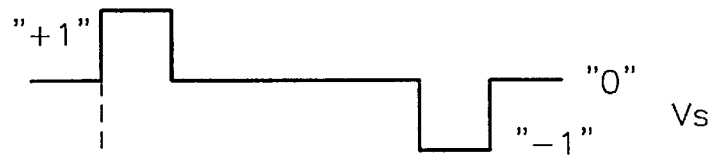
FIGS. 8A through 8G are operational waveforms of the peak detector of FIG. 7.
Figure 8B:
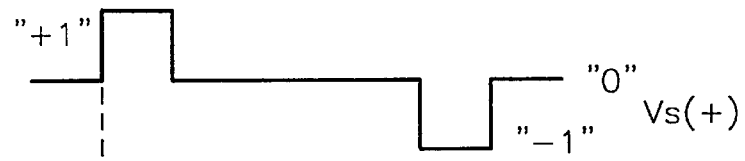
Figure 8C:
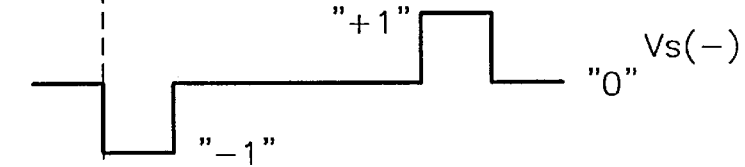
Figure 8D:
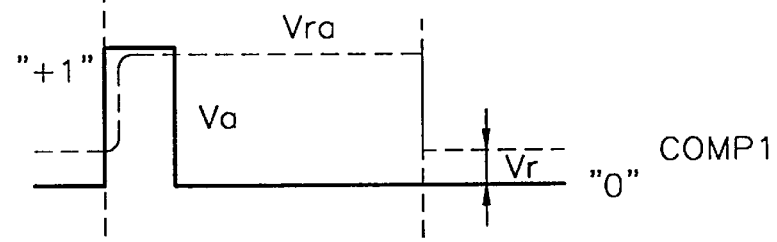

FIGS. 8A through 8G are operational waveforms of the peak detector of FIG. 7. In detail, FIG. 8A is a waveform of the input signal Vs of the AMP1 311, FIG. 8B is a waveform of the positive signal Vs(+) extracted from the input signal Vs, and FIG. 8C is a waveform of the negative signal Vs(−) extracted from the input signal Vs. Also, FIG. 8D is a waveform illustrating the operational principle of the positive peak value detector 330, wherein a solid line represents the output signal Va of the AMP2 312 which is input to the non-inverting port(+) of the comparator COMP1, and a dashed line represents the positive threshold value Vra which is output from the first half-wave rectifier and input to the inverting port (−) of the comparator COMP1. Here, the positive threshold value Vra is reset to the reference voltage Vr when the output signal Ln of the negative peak value detector 350, shown in FIG. 8G, becomes logic "high".

Figure 8E:
Figure 8F:
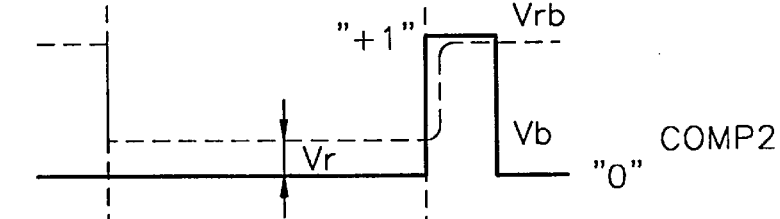
Figure 8G:

FIG. 8E is a waveform of the output signal Hn of the positive peak value detector 330, and FIG. 8F is a waveform illustrating the operational principle of the negative peak detector 350, wherein a solid line represents the output signal Vb of the AMP3 313 which is input to the non-inverting port (+) of the comparator COMP2, and a dashed line represents the negative threshold value Vrb which is output from the second half-wave rectifier of the second ATC 340 and input to the inverting port (−) of the comparator COMP2. Here, the negative threshold value Vrb is reset to the reference voltage Vr when the output signal Hn of the positive peak detector 330, shown in FIG. 8E, becomes logic "high". Lastly, FIG. 8G is a waveform of the output signal Ln of the negative peak detector 350.

According to the present invention, the peak detector of the present invention is applied to a data detector adopting analog mode, capable of performing the Viterbi decoding without needing an A/D converter and a computing circuit which are required for a digital Viterbi decoder, in a system having a PRML-4(+1,0,−1) channel, such as a digital recording/reproducing apparatus. Thus, power consumption and manufacturing costs can be reduced at the same time. For this reason, the peak detector of the present invention is suitable for small and low-power consumption goods, such as a digital video camcorder.

The peak detector of the present invention sets positive and negative threshold values according to an input signal and resets each threshold value based on the detected peak value having the opposite polarity thereto, to detect the peak value of the input signal. Accordingly, data detection errors caused by incompletely updating the threshold values within the required time can be improved, as well as the performance of the Viterbi decoding.

What is claimed is:

1. A peak detector comprising:
   a detector which detects positive and negative peak values from an input signal having digital information, based on positive and negative threshold values; and
   a threshold controller which evaluates the positive threshold value and the negative threshold value according to positive and negative values of the input signal, respectively, and resets the positive threshold value to a first predetermined value and resets the negative threshold value to a second predetermined value, based on the detected peak value having polarity opposite thereto.

2. A peak detector for a maximum likelihood decoding system, comprising:
   a positive peak value detector which compares a positive portion of an input signal having digital information with a positive threshold value, to detect a positive peak value;
   a negative peak value detector which compares a negative portion of the input signal with a negative threshold value, to detect a negative peak value;
   a first automatic threshold controller which evaluates the positive threshold value according to positive values of the input signal and which resets the positive threshold value to a first predetermined value, based on the negative peak value; and
   a second automatic threshold controller which evaluates the negative threshold value according to negative values of the input signal and which resets the negative threshold value to a second predetermined value, based on the positive peak value.

3. The peak detector of claim 2, wherein the first predetermined value and the second predetermined value are the same.

4. The peak detector of claim 2, wherein the first automatic threshold controller comprises:
   a first half-wave rectifier which outputs the positive threshold value according to the positive values of the input signal; and
   first reset means which is enabled according to the negative peak value fed back from the negative peak value detector, and which resets the positive threshold value to the first predetermined value.

5. The peak detector of claim 4, wherein the first reset means comprises a first transistor having a base connected to the output of the negative peak value detector via a base resistor, a collector connected to the output of the first half-wave rectifier, and an emitter connected to a predetermined reference voltage source, to reset the positive threshold value output from the first half-wave rectifier to a reference voltage of the predetermined reference voltage source according to an active state of the negative peak value.

6. The peak detector of claim 2, wherein the second automatic threshold controller comprises:
   a second half-wave rectifier which outputs the negative threshold value according to the negative values of the input signal; and
   second reset means which is enabled according to the positive peak value fed back from the positive peak value detector, and resets the negative threshold value to the second predetermined value.

7. The peak detector of claim 6, wherein the second reset means comprises a second transistor having a base connected to the output of the positive peak value detector via a base resistor, a collector connected to the output of the second half-wave rectifier, and an emitter connected to a predetermined reference voltage source, to reset the negative threshold value output from the second half-wave rectifier to a reference voltage of the predetermined reference voltage source according to an active state of the positive peak value.

8. The peak detector of claim 2, further comprising a plurality of amplifiers which separate the input signal into two signals each having positive and negative values, and amplify the separated signals to output to the first and second automatic threshold controllers, respectively.

9. A data detector for a digital recording/reproducing apparatus including an equalizer which equalizes a reproduced signal and outputs an equalized signal, a peak detector which detects positive and negative peak values of the equalized signal according to positive and negative threshold values, for respectively detecting the positive and negative peak values, and a Viterbi decoder which receives the positive and negative peak values for a Viterbi decoding, the peak detector comprising:
   a positive peak value detector which compares a positive portion of an input signal having digital information with the positive threshold value to detect the positive peak value;
   a negative peak value detector which compares a negative portion of the input signal with the negative threshold value to detect the negative peak value;
   a first automatic threshold controller which controls the positive threshold value according to the input signal having a positive value to reset based on the negative peak value the positive threshold value to a first predetermined value; and a second automatic threshold controller which controls the negative threshold value according to the input signal having a negative value to reset based on the positive peak value, the negative peak value to a second predetermined value.

10. The data detector of claim 9, wherein the first predetermined value and the second predetermined value are the same.

11. The data detector of claim 9, wherein the first automatic threshold controller comprises:

a first half-wave rectifier which outputs the positive threshold value according to the positive values of the input signal; and first switching means which is enabled according to the negative peak value fed back from the negative peak value detector, and sets the positive threshold value to the first predetermined value.

12. The data detector of claim 11, wherein the first switching means comprises a first transistor having a base connected to the output of the negative peak value detector via a base resistor, a collector connected to the output of the first half-wave rectifier, and an emitter connected to a predetermined reference voltage source, to set the positive threshold value output from the first half-wave rectifier to a reference voltage of the predetermined reference voltage source according to an active state of the negative peak value.

13. The data detector of claim 9, wherein the second automatic threshold controller comprises:

a second half-wave rectifier which outputs the negative threshold value according to the negative values of the input signal; and second switching means which is enabled according to the positive peak value fed back from the positive peak value detector, and which sets the negative threshold value to the second predetermined value.

14. The data detector of claim 13, wherein the second switching means comprises a second transistor having a base connected to the output of the positive peak value detector via a base resistor, a collector connected to the output of the second half-wave rectifier, and an emitter connected to a predetermined reference voltage source, to set the negative threshold value output from the second half-wave rectifier to a reference voltage of the predetermined reference voltage source according to an active state of the positive peak value.

15. The data detector of claim 9, further comprising a plurality of amplifiers which separate the input signal into two signals each having positive and negative values, and amplify the separated signals to output to the first and second automatic threshold controllers, respectively.

16. A peak detection method comprising the steps of:

(a) detecting positive and negative peak values from an input signal having digital information, based on positive and negative threshold values; and (b) evaluating the positive threshold value and the negative threshold value according to positive and negative values of the input signal, respectively, to reset the positive threshold value to a first predetermined value and the negative threshold value to a second predetermined value, based on the detected peak value having polarity opposite thereto.

17. A peak detection method for improving performance of Viterbi decoding in a maximum likelihood system, the method comprising the steps of:

(a) comparing a positive portion of an input signal, having digital information with a positive threshold value for detecting a positive peak value, to detect the positive peak value;

(b) comparing a negative portion of the input signal, with a negative threshold value for detecting a negative peak value, to detect the negative peak value;

(c) evaluating the positive threshold value according to the positive values of the input signal and resetting the positive threshold value to a first predetermined value, based on the negative peak value; and (d) evaluating the negative threshold value according to the negative values of the input signal and resetting the negative threshold value to a second predetermined value, based on the positive peak value.

18. The peak detection method of claim 17, wherein the first predetermined value and the second predetermined value are the same.

* * * * *